(12) United States Patent
Holder et al.

(10) Patent No.: US 6,183,553 B1
(45) Date of Patent: Feb. 6, 2001

(54) PROCESS AND APPARATUS FOR PREPARATION OF SILICON CRYSTALS WITH REDUCED METAL CONTENT

(75) Inventors: John D. Holder, Lake St. Louis; Steven M. Joslin, St. Peters; Harold W. Korb, Town & Country, all of MO (US)

(73) Assignee: MEMC Electronic Materials, Inc., St. Peters, MO (US)

(*) Notice: Under 35 U.S.C. 154(b), the term of this patent shall be extended for 0 days.

(21) Appl. No.: 09/097,779

(22) Filed: Jun. 15, 1998

(51) Int. Cl.[7] .................................................. C30B 15/10
(52) U.S. Cl. ............................ 117/13; 117/217; 117/900; 117/932
(58) Field of Search ..................................... 117/900, 217, 117/932, 13

(56) References Cited

U.S. PATENT DOCUMENTS

| | | | |
|---|---|---|---|
| 3,157,541 | 11/1964 | Heywang et al. | 148/174 |
| 4,194,028 | 3/1980 | Sirtl et al. | 427/249 |
| 4,288,495 | 9/1981 | Terner et al. | 428/446 |
| 4,617,232 | 10/1986 | Chandler et al. | 428/328 |
| 4,621,017 | 11/1986 | Chandler et al. | 428/328 |
| 4,911,896 | * 3/1990 | Bihuniak et al. | 117/900 |
| 5,041,308 | 8/1991 | Kuramoto | 427/213 |
| 5,098,675 | * 3/1992 | Matsuo et al. | 117/932 |
| 5,358,603 | 10/1994 | Ibrahim et al. | 156/657 |
| 5,405,658 | 4/1995 | Ibrahim et al. | 427/388 |
| 5,417,803 | 5/1995 | Goldstein et al. | 156/662.1 |
| 5,476,679 | 12/1995 | Lewis et al. | 427/122 |

FOREIGN PATENT DOCUMENTS

| | | | |
|---|---|---|---|
| 529594 | * 3/1993 | (EP) | 117/900 |
| 2402009 | 3/1979 | (FR) | |
| 63-166789 | * 7/1988 | (JP) | 117/900 |
| 2-018375 | 1/1990 | (JP) | |
| 6-127925 | 10/1992 | (JP) | |
| 7-257987 | 10/1995 | (JP) | |

OTHER PUBLICATIONS

Gilmore, Damien, et al., "The Impact Of Furnace Graphite Parts On CZ–Grown Single Crystal Silicon's Radial Impurity Disribution," *Electrochemical Society Proceedings*, Proceedings on the Fourth International Symposium on High Purity Silicon, vol. 96–13, pp. 102–113.

Scheiffarth, Jakob H., et al., "Increasing high temperature oxidation and corrosion resistance of graphite and carbon–fiber–reinforced carbon by deposition of a low pressure chemically vapor–deposited silicon carbide coating," *Surface and Coatings Technology*, 54/55 (1992), pp. 13–18.

PCT International Search Report for PCT/US99/13378, Dated Sep. 17, 1999.

* cited by examiner

Primary Examiner—Robert Kunemund
(74) Attorney, Agent, or Firm—Senniger, Powers, Leavitt & Roedel

(57) ABSTRACT

A method and apparatus for producing silicon single crystals with reduced contamination is disclosed. In one embodiment the structural components constructed of graphite and located in the hot zone of the crystal pulling apparatus have two protective layers. The first protective layer is applied directly to the graphite component. The second protective layer is a silicon layer and is applied on top of the first protective layer and covers the first layer. In a second embodiment, the structural components constructed of graphite and located in the hot zone of the crystal pulling apparatus have a single protective layer. The single protective layer is applied directly to the graphite and consists of a mixture of silicon carbide and silicon.

28 Claims, 3 Drawing Sheets

PROCESS AND APPARATUS FOR PREPARATION OF SILICON CRYSTALS WITH REDUCED METAL CONTENT

BACKGROUND OF THE INVENTION

The present invention relates to a process and apparatus for the preparation of single silicon crystals having a reduced level of contamination. More specifically, the present invention relates to a process and apparatus for the preparation of single silicon crystals wherein the structural graphite components in the crystal growth chamber of a Czochralski crystal pulling apparatus have been coated either with two protective layers including a first protective layer such as silicon carbide or glassy carbon, and a second protective layer of silicon, or coated with a single protective layer comprising a mixture of silicon carbide and silicon.

Single crystal silicon which is the starting material for most processes for the fabrication of semiconductor electronic components is commonly prepared with the so-called Czochralski process. In this process, polycrystalline silicon ("polysilicon") is charged to a crucible, the polysilicon is melted, a seed crystal is immersed into the molten silicon and a single crystal silicon ingot is grown by slow extraction to a desired diameter.

The crystal pulling apparatus commonly utilized in the Czochralski process contains numerous internal parts surrounding the molten silicon containing crucible. These internal parts are constructed of graphite and generally referred to as "hot zone" parts. These hot zone parts, such as susceptors, heaters, thermal shields, heat reflectors or insulation, control the heat flow around the crucible and the cooling rate of the growing crystal. It has been recognized in the art for some time that although the graphite components used in the crystal pulling apparatus are not in direct contact with the molten silicon or the growing crystal, the use of such components at the high temperatures necessary to melt the polysilicon and grow the resulting crystal can result in the outgassing of particles and resulting high level contamination of the melt and subsequently the grown crystal with molybdenum, iron, copper, nickel, and other unwanted contaminants. It is well known that metals such as iron and molybdenum reduce minority carrier lifetimes in silicon wafers and copper and nickel can lead to oxygen induced stacking faults in the resulting crystal. Also, oxygen produced during the crystal growing process through the interaction of the silicon melt and the crucible which is present around the graphite components can cause the graphite to undergo oxidation and cause the further release of particles from pores in the graphite, as well as weaken the graphite structure and cause the parts to buckle.

In order to reduce the risk of crystal contamination with contaminants which can be outgassed by graphite parts located around the growing crystal, it has been common for all graphite components contained in the hot zone to be coated with a protective barrier layer such as silicon carbide or a glassy carbon coating. Because of its high temperature oxidation resistance, silicon carbide is widely used to coat graphite parts used in the hot zone of a crystal pulling apparatus. Silicon carbide coatings provide a barrier to impurity outgassing by sealing the graphite surface, thus requiring impurities to pass through the coating by grain boundary and bulk diffusion mechanisms. This coating is used to contain unwanted contaminants that are generated by the graphite during the crystal pulling process. The silicon carbide layer is generally on the order of about 75 to about 150 micrometers thick, and covers the graphite surface. One method of depositing a silicon carbide layer over graphite is described by Scheiffarth and Wagner in *Surface and Coatings Technology,* 54/55 (1992) 13–18.

Similar to the silicon carbide coating the glassy carbon coating on graphite is used to contain unwanted contaminants that the graphite generates during exposure to high temperature. A method of providing a glassy carbon layer over a graphite body is described by Lewis et al. in U.S. Pat. No. 5,476,679.

Although the use of a silicon carbide coating or glassy carbon coating over graphite has reduced the amount of undesirable contaminants entering the silicon melt and/or the grown crystal, neither approach has been successful in totally eliminating the problem of particulate generation by graphite and the resultant contamination the grown crystal. Iron contamination from graphite remains a prominent problem even with the use of a silicon carbide or glassy carbon coating. Undesirable metals such as iron appear able to penetrate these coatings in an amount sufficient to degrade the resulting crystal. Also, it is believed that the typical silicon carbide coating provided by industry is itself contaminated with about 1 ppma iron. When this coating is heated in the silicon crystal growth environment, the iron can diffuse to the surface, evaporate, and become attached to the growing crystal.

Therefore, a need still exists in the semiconductor industry for a method which will further reduce the level of contaminants entering the silicon melt during the crystal growing process due to particulates generated from components within the hot zone of the crystal pulling apparatus.

SUMMARY OF THE INVENTION

Among the objects of the present invention, therefore, are the provision of a process for preparing single silicon crystals having a reduced level of contaminants; the provision of a process for coating silicon carbide or glassy carbon coated graphite components with a silicon layer; the provision of a process for coating graphite components with a mixture of silicon and silicon carbide; the provision of a process for gettering silicon crystal defect causing contaminants before they enter the melt or crystal; the provision of an apparatus for pulling silicon single crystals having a reduced level of metal contamination; the provision of a graphite component having two protective layers capable of reducing overall metal contamination in grown crystals; the provision of a graphite component having a single protective layer capable of reducing overall metal contamination in grown crystals; and the provision of increasing overall single crystal silicon yield.

Briefly, therefore, the present invention is directed to an apparatus for producing a silicon single crystal having a reduced amount of metal contamination grown by the Czochralski process. The apparatus comprises a growth chamber having a quartz crucible and structural components disposed within it. The structural components are constructed of graphite and are coated with two different protective layers. The first protective layer on the surface of the graphite structure is applied directly to the graphite and may be either silicon carbide or glassy carbon. The second protective layer covers the first layer, and is comprised of silicon.

The invention is further directed to an apparatus for producing a silicon single crystal having a reduced amount of metal contamination grown by the Czochralski process. The apparatus comprises a growth chamber having a quartz crucible and structural components disposed within it. The structural components are constructed of graphite and are coated with a protective layer. The protective layer is comprised of a mixture of silicon carbide and silicon.

The invention is further directed to a process for preparing a silicon single crystal having a reduced amount of metal contamination grown by the Czochralski process. The process includes coating a structural component constructed of graphite and disposed within the growth chamber with two separate protective coatings prior to initiating the crystal growing process. The first protective coating on the surface of the graphite is comprised of silicon carbide or glassy carbon. The second coating is comprised of silicon and covers the first coating. After the silicon coating is applied to the components the crystal pulling process is initiated.

The invention is still further directed to a process for preparing a silicon single crystal having a reduced amount of metal contamination grown by the Czochralski process. The process includes coating a structural component constructed of graphite with a protective layer comprised of silicon carbide and silicon prior to initiating the crystal growing process. After the protective coating is applied, the crystal pulling process is initiated.

The invention is still further directed to a graphite component having two protective coatings. The first protective coating is comprised of silicon carbide or glassy carbon, and the second protective coating is silicon.

The invention is further directed to a graphite component having a single protective coating. The protective coating is comprised of a mixture of silicon carbide and silicon.

Other objects and features of this invention will be in part apparent and in part pointed out hereinafter.

BRIEF DESCRIPTION OF THE DRAWINGS

Corresponding reference characters indicate corresponding parts throughout the drawings.

DETAILED DESCRIPTION OF THE PREFERRED EMBODIMENTS

In accordance with the present invention, it has been discovered that applying either a protective coating of silicon over a silicon carbide or glassy carbon coated graphite component or a protective coating of a mixture of silicon carbide and silicon to a graphite component located within the growth chamber of a crystal pulling apparatus significantly reduces the resulting metal contamination in the grown crystal. Advantageously, the silicon layer overlaying the silicon carbide or glassy carbon coated graphite or the silicon mixed with the silicon carbide acts as a gettering sink for contaminants such as iron which outdiffuse from the graphite components or silicon carbide coating at the high temperature required to grow the crystal and keeps the contaminating metals from entering the silicon melt or growing crystal.

Figure 1:
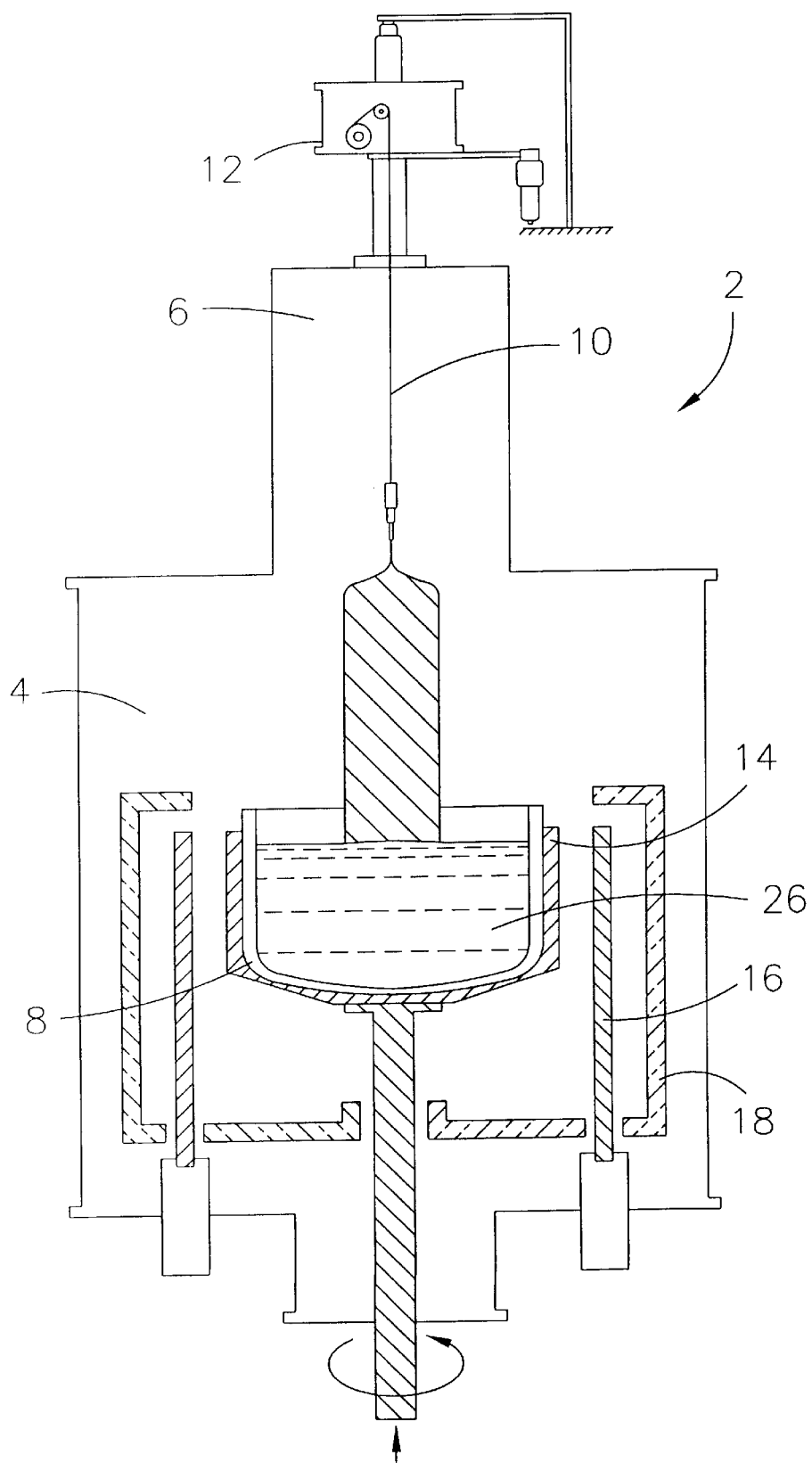
FIG. 1 is a diagram of a silicon single crystal pulling apparatus.

Referring now to the Figures, and particularly to FIG. 1, there is shown a crystal pulling apparatus indicated generally at 2. The apparatus comprises a crystal growth chamber 4 and a crystal chamber 6. Contained within crystal growth chamber 4 is a silica crucible 8 which contains molten polysilicon 26 for growing the silicon single crystal. A pulling wire 10 attached to a wire rotation device 12 is used to slowly extract the growing crystal during operation. Also contained within the crystal growth chamber 4 are several structural components constructed of graphite which surround the crucible such as a susceptor 14 for holding the crucible in place, a heater 16 for heating the silicon melt, and a thermal shield 18 for retaining heat near the crucible. As previously stated, these structural components are located in the crystal growth chamber in the "hot zone" are constructed of graphite and control the heat flow around the crucible and the rate of cooling of the silicon single crystal. It should be recognized by one skilled in the art that other structural components constructed of graphite such as heat reflectors, gas purge tubes, view port channels or insulation could also be located in the hot zone and be prepared for use in accordance with the present invention.

Graphite utilized to construct the hot zone components is generally at least about 99.9% pure graphite, and preferably at least about 99.99% or more pure graphite. Also, the graphite contains less than about 20 ppm total metals such as iron, molybdenum, copper, and nickel, and preferably less that about 5 ppm total metals such as iron, molybdenum, copper, and nickel. Generally, as the purity of the graphite increases, the amount of particle generation during high temperature heating decreases.

In one embodiment of the present invention, the structural components described above have a first protective coating of silicon carbide or glassy carbon which covers the component. The first protective coating of silicon carbide or glassy carbon is generally between about 75 and about 150 micrometers, preferably about 125 micrometers in thickness. Structural components constructed of graphite and having a silicon carbide or glassy carbon coating are commercially available from Graphite Die Mold, Inc. (Durham, Conn.) The first protective coating acts as a barrier layer to seal in and contain contaminants which outdiffuse from and are released from the graphite during exposure to high temperature during the crystal pulling process. The structural components used in the crystal pulling apparatus of the present invention have a separate, second layer of silicon overlaying the first protective layer.

The protective coating of silicon on top of the silicon carbide or glassy carbon coating provides a protective chemical barrier which acts as a gettering sink to getter contaminants produced from the graphite components which are able to pass through the first protective coating, or contaminants such as iron evaporated from the first protective coating. Because of the high affinity of silicon for the contaminants, the silicon in the second layer readily reacts with the contaminants to form stable silicides, such as $Fe_3Si$, $FeSi$, and $FeSi_2$. The formation of stable silicides between the contaminant and the silicon layer drastically reduces the diffusion capability of the contaminant to pass through the silicon layer. As such, a significant reduction in contaminants entering the silicon melt and the growing crystal is realized.

The protective silicon layer is grown on the silicon carbide or glassy carbon coated graphite component prior to use in the crystal growing process by chemical vapor deposition techniques known in the art such as ultra high vacuum chemical vapor deposition (UHVCVD) or atmospheric pressure chemical vapor deposition (APCVD). Suitable source gases for the protective silicon layer deposition include such gases as monochlorosilane, dichlorosilane, and trichlorosilane. These gases can be combined with a carrier gas such as hydrogen at a ratio of, for example, 30:1 carrier gas to silane source, to facilitate growth of the silicon layer.

The silicon layer is grown on top of the silicon carbide or glassy carbon layer to a thickness of between about 0.1 and about 3 micrometers, more preferably between about 0.5 and about 2 micrometers, and most preferably about 1 micrometer. The protective silicon layer can be grown on one or more portions of the silicon carbide or glassy carbon coated graphite to help minimize resulting contamination in the grown crystal. It is preferable, however, to grow the silicon layer such that it entirely covers the underlying silicon carbide or glassy carbon coated graphite. If the silicon layer entirely covers the underlying layer, maximum protection against crystal contamination by graphite particulate generation is achieved.

The silicon layer can be grown at any temperature that facilitates silicon deposition through chemical vapor deposition. Examples of suitable temperature ranges include between about 900° C. and about 1300° C. However, it will be recognized by one skilled in the art that other temperature ranges may be suitable, and may affect the rate of deposition of the silicon onto the silicon carbide coated graphite.

In a preferred embodiment utilizing the first and second protective layers, prior to use in the crystal growing apparatus and process, the structural component constructed of graphite and having a silicon carbide or glassy carbon coating is subjected to at least two separate deposition cycles of silicon to coat the surface of silicon carbide or glassy carbon with silicon to enable sufficient gettering. The first deposition cycle deposits about 0.1 to about 1.5 micrometers of silicon on the silicon carbide or glassy carbon coated surface. Subsequently, the structural component is rotated so that all portions of the component are equally treated with the deposition of silicon. After rotation, a subsequent deposition cycle is initiated and about another about 0.1 to about 1.5 micrometers of silicon is deposited on the surface. The resulting structural component has a layer of silicon of about 0.1 to about 3 micrometers in thickness. After the protective silicon layer has been applied, the component can be used in the crystal growing apparatus and process and a crystal can be pulled from a molten pool of silicon.

The structural components constructed of graphite and having two protective layers of the present invention can be used in the crystal pulling apparatus of the present invention and several single silicon crystals grown before the protective silicon layer may be removed and replaced. Preferably, the components are utilized for the growing of between 25 and about 125 single silicon crystals, more preferably about 100 silicon crystals before the protective silicon coating is removed and replaced. The protective silicon layer can be removed using a dilute acidic solution such as dilute hydrofluoric acid. The dilute acid strips off the silicon layer and leaves the underlying first protective layer in tact. The graphite component can then be subjected to silicon chemical vapor deposition as described above to form a new second protective coating on top of the first silicon carbide or glassy carbon protective coating.

In an alternative embodiment of the present invention, the structural components described above have a single protective coating applied directly on the graphite surface. This single protective coating is comprised of a mixture of silicon carbide and silicon. Similar to the embodiment described above using two protective layers, the silicon intermixed with the silicon carbide acts as a gettering sink to getter contaminants released from the graphite components or the silicon carbide itself and forms stable silicides.

The single protective layer is grown directly on the graphite components as described above. The single protective layer is between about 75 and about 150 micrometers thick, preferably about 125 micrometers thick and comprises between about 99.9% to about 99.99% silicon carbide and between about 0.01% to about 0.1% silicon, preferable about 99.9% silicon carbide and about 0.1% silicon.

The present invention is illustrated by the following examples which are merely for the purpose of illustration and are not to be regarded as limiting the scope of the invention or manner in which it may be practiced.

EXAMPLE 1

In this Example, a graphite sample having a first protective coating of silicon carbide was treated to form a second protective coating of silicon on top of the first protective coating for use in Example 2.

In a horizontal tube furnace having a temperature of about 1100° C., a graphite sample having a first protective coating of silicon carbide about 100 micrometers thick was subjected to two sequential deposition cycles to grow a silicon protective layer on top of the silicon carbide layer. In each of the two cycles, the source gas for depositing the protective silicon coating was a mixture having a ratio 1:30 of trichlorosilane and hydrogen. Each cycle lasted about 10 minutes and deposited about 1 micrometer of silicon on the silicon carbide surface. The pressure was atmospheric pressure, and the sample was rotated after the first deposition cycle to ensure sufficient coverage of the silicon carbide coating with the silicon. The resulting sample constructed of graphite had a first protective coating of silicon carbide and a second protective coating of silicon about 2 micrometers thick.

EXAMPLE 2

In this Example, the level of iron contamination of a monitor wafer exposed to bare graphite, graphite coated with glassy carbon, graphite coated with silicon carbide, and graphite having a first protective layer of silicon carbide and a second protective layer of silicon was measured.

A horizontal furnace tube was used to expose monitor wafers via gas diffusion to four separate samples: 1) graphite without any protective coating; 2) graphite coated with 100 micrometers of glassy carbon; 3) graphite coated with 100 micrometers of silicon carbide; and 4) graphite having a first protective layer of silicon carbide being about 100 micrometers thick and a second protective layer of silicon being about 2 micrometers thick. A fused silica mask was utilized to separate a monitor wafer from each test sample and prevent direct contact between the monitor wafer and the sample. Several holes in the mask allowed the monitor wafer to be exposed to gases generated from the sample materials. Each test stack consisted of a monitor wafer for measuring the amount iron transferred via diffusion, a fused silica mask on top of the monitor wafer, and a sample on top of the hole in the mask. For each run, one wafer was used as a background sample and did not have a mask or samples on it.

Each of the four samples were tested to measure iron diffusivity from the sample to the monitor wafer at three different temperatures: 800° C., 950° C., and 1100° C. The samples were held at atmospheric pressure throughout the two hour heat treatment, and a stream of argon gas over the wafers was maintained.

After each heat treatment, each monitor wafer for each sample was tested for minority carrier lifetime (amount of iron present) using the surface photovoltaic technique described in ASTM Report F391-78. Several points on each sample were tested for iron concentration, and the average value of iron concentration across the wafer surface was recorded. The resulting iron concentration data for the 12 samples were divided by the heat treatment time and the thickness of the wafer and plotted as atoms per square centimeter per hour versus inverse absolute temperature (1/°C.+273) on a logarithmic scale. The results are shown in FIG. 2.

Figure 2:
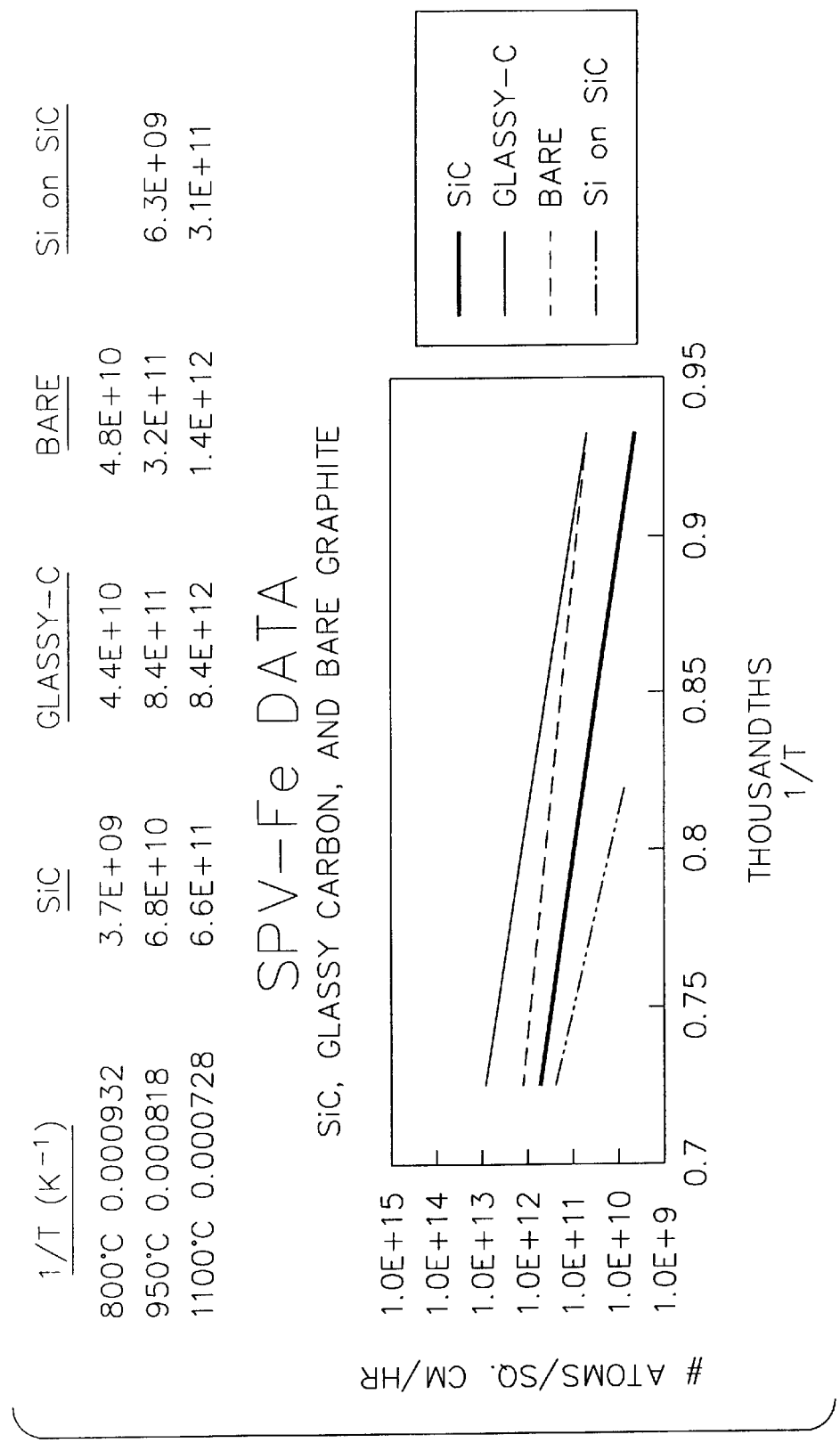
FIG. 2 is graph of experimental results showing the amount of iron contamination on monitor wafers generated by four separate samples.

As shown in FIG. 2, the sample of graphite having a first protective coating of silicon carbide and a second protective coating of silicon diffused the least amount of iron from the sample to the monitor wafer. As FIG. 2 indicates, the amount of iron present on the monitor wafer for the sample of graphite having a first protective coating of silicon carbide and a second protective coating of silicon at 800° C. was too low to be detected by the analytical method, and hence no data point for this sample was determined for 800° C. At all three temperatures a significant reduction in iron diffusivity was realized by using a second protective coating of silicon over a silicon carbide coated graphite sample.

EXAMPLE 3

In this Example, equilibrium thermodynamic calculations were utilized to calculate the amount of iron evaporated from mixtures containing silicon carbide, various amounts of silicon, and iron in an argon gas atmosphere.

The calculations assumed the argon gas to be at 0.016 mbar and the temperature range utilized was 600° C. to 1400° C. Each mixture consisted of 0.1 moles of silicon carbide and $1 \times 10^{-7}$ moles of iron. This ratio corresponded to 100 cm$^2$ of silicon carbide, 125 micrometers thick, containing 1 ppma iron.

Figure 3:
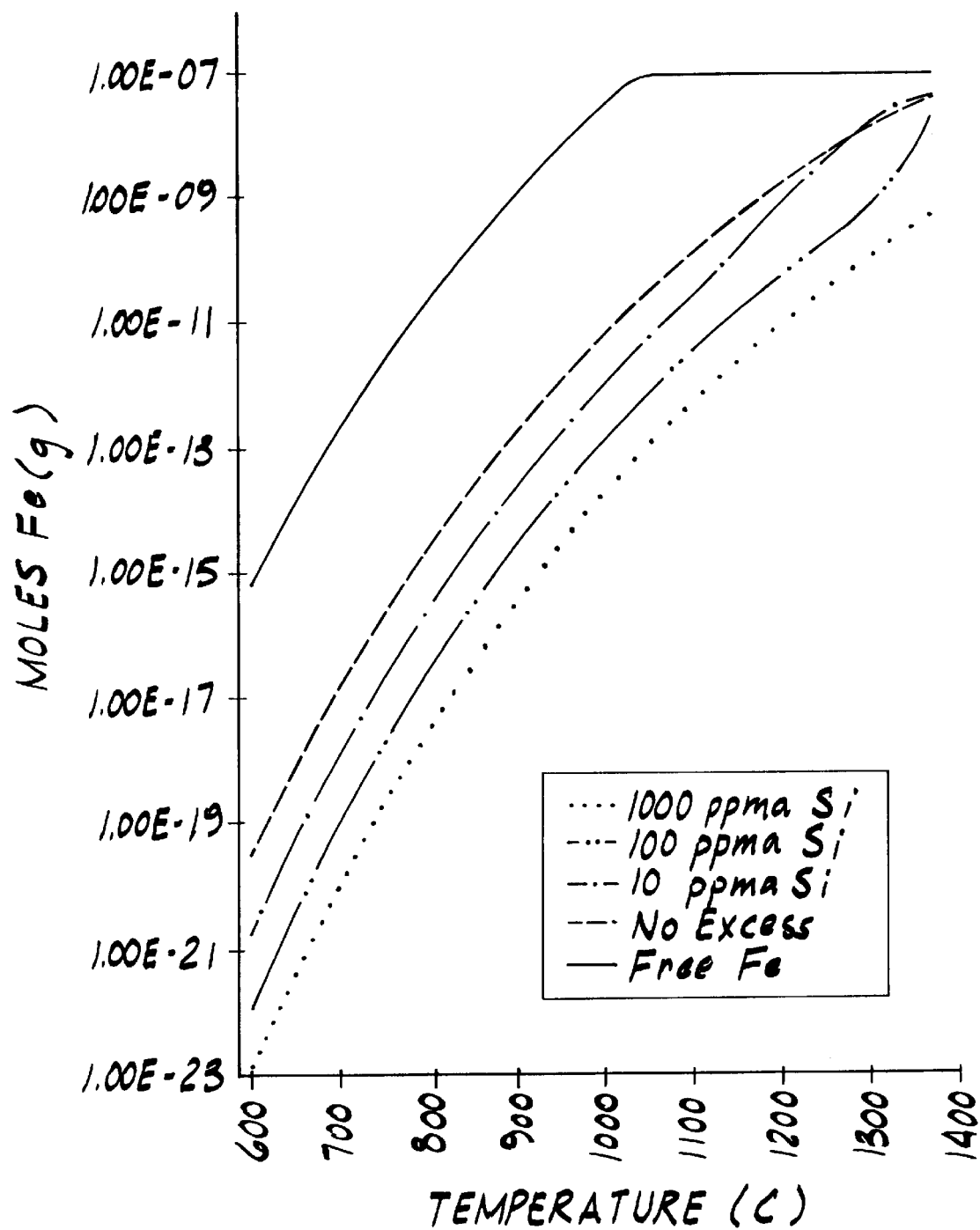
FIG. 3 is a graph of theoretical calculations showing the effect of a protective coating of a mixture of silicon carbide and silicon on graphite.

The amount of silicon introduced into the silicon carbide varied from 0 ppma to 1000 ppma of the silicon carbide-iron mixture. One mole of argon was used to establish the volume of the thermodynamic system. FIG. 3 shows the resulting calculated moles of iron vapor from $1 \times 10^{-7}$ moles of free iron, and from silicon carbide-iron mixtures with no excess silicon and with 10, 100, and 1000 ppma silicon.

FIG. 3 shows that the release of iron vapor contaminated silicon carbide coating is significantly reduced by increasing the amount of silicon intermixed with the silicon carbide coating. As shown, a mixture of 1000 ppma of silicon in silicon carbide is calculated to reduce the iron vapor given off by the coating by about 1/100 at 1200° C. and by about 1/1000 at 700° C.

The calculations for the release of iron from silicon carbide-silicon-iron mixtures were made using HSC Chemistry, version 2, software developed and published by Outkumpu Research (Pori, Finland).

In view of the above, it will be seen that the several objects of the invention are achieved.

As various changes could be made in the above-described process or apparatus without departing from the scope of the invention, it is intended that all matter contained in the above description be interpreted as illustrative and not in a limiting sense.

What is claimed is:

1. A crystal pulling apparatus for producing a silicon single crystal having a reduced amount of metal contamination grown by the Czochralski process, the apparatus comprising:

a growth chamber; and a structural component disposed within the growth chamber, the component comprising graphite and having a first protective layer covering the graphite and a second protective layer on top of the first protective layer, the second protective layer being silicon and covering the first protective layer.

2. The apparatus as set forth in claim 1 wherein the second protective layer on the structural component is between about 0.1 and about 3 micrometers thick.

3. The apparatus as set forth in claim 1 wherein the second protective layer on the structural component is between about 0.5 and about 1 micrometers thick.

4. The apparatus as set forth in claim 1 wherein the first protective layer is silicon carbide.

5. The apparatus as set forth in claim 1 wherein the first protective layer is glassy carbon.

6. The apparatus as set forth in claim 1 wherein the first protective layer is silicon carbide having a thickness of about 125 micrometers and the second protective layer has a thickness of between about 0.5 and about 1 micrometers.

7. A crystal pulling apparatus for producing a silicon single crystal having a reduced amount of metal contamination grown by the Czochralski process, the apparatus comprising:

a growth chamber; and a structural component disposed within the growth chamber, the component comprising graphite and having a protective layer covering the graphite, the protective layer comprising between about 0.01% and about 0.1% silicon and between about 99.9% and about 99.99% silicon carbide.

8. The apparatus as set forth in claim 7 wherein the protective coating has a thickness of between about 75 and about 125 micrometers and is comprised of about 0.1% silicon and about 99.9% silicon carbide.

9. A process for controlling the contamination of a silicon single crystal ingot with metal associated with a graphite containing component used in a crystal pulling apparatus during the growth of the silicon crystal, the process comprising:

coating a structural component constructed of graphite for use within a growth chamber of a crystal pulling apparatus with a first protective layer that covers the component and a second protective layer of silicon that covers the first protective layer; and pulling the silicon single crystal from a pool of molten silicon within the growth chamber.

10. The process as set forth in claim 9 wherein the second protective layer has a thickness of between about 0.1 and about 3 micrometers.

11. The process as set forth in claim 9 wherein the second protective layer has a thickness of between about 0.5 and about 1 micrometers.

12. The process as set forth in claim 9 wherein the first protective layer is silicon carbide.

13. The process as set forth in claim 9 wherein the first protective layer is glassy carbon.

14. The process as set forth in claim 9 wherein the first protective layer is silicon carbide having a thickness of about 125 micrometers and the second protective layer is between about 0.5 and about 1 micrometers thick.

15. A process for controlling the contamination of a silicon single crystal ingot with metal associated with a graphite containing component used in a crystal pulling apparatus during the growth of the silicon crystal, the process comprising:

coating a structural component constructed of graphite for use within a growth chamber of a crystal pulling apparatus with a protective layer that covers the component, the protective layer comprising between about 0.01% and about 0.1% silicon and between about 99.9% and about 99.99% silicon carbide; and pulling the silicon single crystal from a pool of molten silicon with the growth chamber.

16. The process as set forth in claim 15 wherein the protective coating has a thickness of about 125 micrometers and is comprised of about 99.9% silicon carbide and about 0.1% silicon.

17. A component for use in a silicon single crystal pulling apparatus, the component comprising graphite and having a first protective layer covering the graphite and a second protective layer covering the first protective layer wherein the second protective layer is silicon.

18. A graphite component as set forth in claim 17 wherein the graphite contains no more than about 20 ppm total of iron, copper, nickel, and molybdenum.

19. A graphite component as set forth in claim 17 wherein the graphite contains no more than about 5 ppm total of iron, copper, nickel, and molybdenum.

20. A graphite component as set forth in claim 17 wherein the first protective coating is silicon carbide.

21. A graphite component as set forth in claim 17 wherein the first protective coating is glassy carbon.

22. A graphite component as set forth in claim 17 wherein the second protective coating has a thickness of between about 0.1 and about 3 micrometers.

23. A graphite component as set forth in claim 17 wherein the second protective coating has a thickness of between about 0.5 and about 1 micrometers.

24. A graphite component as set forth in claim 17 wherein the graphite contains no more than about 5 ppm total of iron, copper, nickel, and molybdenum, the first protective coating is silicon carbide, and the second protective coating has a thickness of about 1 micrometer.

25. A graphite component as set forth in claim 17 wherein the component is a susceptor.

26. A graphite component as set forth in claim 17 wherein the component is a heater.

27. A graphite component as set forth in claim 17 wherein the component is a thermal shield.

28. A graphite component as set forth in claim 17 wherein the component is a heat reflector.

\* \* \* \* \*